United States Patent
Hill et al.

(10) Patent No.: US 9,690,478 B2
(45) Date of Patent: Jun. 27, 2017

(54) METHOD AND SYSTEM FOR PROCESSING GESTURES TO CAUSE COMPUTATION OF MEASUREMENT OF AN ANGLE OR A SEGMENT USING A TOUCH SYSTEM

(71) Applicant: Texas Instruments Incorporated, Dallas, TX (US)

(72) Inventors: Joe Dean Hill, Wylie, TX (US); Michel Georges Stella, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 2 days.

(21) Appl. No.: 14/638,735

(22) Filed: Mar. 4, 2015

(65) Prior Publication Data
US 2015/0253981 A1  Sep. 10, 2015

Related U.S. Application Data

(60) Provisional application No. 61/947,747, filed on Mar. 4, 2014.

(51) Int. Cl.
  *G06F 3/041*  (2006.01)
  *G06F 3/0488*  (2013.01)
  *G06F 3/01*  (2006.01)
  *G06F 3/0484*  (2013.01)
  (Continued)

(52) U.S. Cl.
  CPC .......... *G06F 3/04883* (2013.01); *G06F 3/017* (2013.01); *G06F 3/0488* (2013.01); *G06F 3/04842* (2013.01); *G06F 3/041* (2013.01); *G06F 3/0412* (2013.01); *G06F 17/50* (2013.01); *G06F 2203/04101* (2013.01); *G06T 11/203* (2013.01)

(58) Field of Classification Search
  CPC ........ G06F 3/017; G06F 3/041; G06F 3/0412; G06F 3/0488; G06F 3/04883; G06F 17/50; G06F 2203/04101; G06T 11/203
  See application file for complete search history.

(56) References Cited

U.S. PATENT DOCUMENTS 5,555,363 A  *  9/1996  Tou ..................... G06F 3/04883
                                                                715/205
5,861,874 A  *  1/1999  Joto ..................... G06F 3/0488
                                                                178/18.01

(Continued)

*Primary Examiner* — Michael J Eurice
(74) *Attorney, Agent, or Firm* — Kenneth Liu; Charles A. Brill; Frank D. Cimino

(57) ABSTRACT

A method and a system for processing gestures to cause computation of measurements of an angle or a segment using a touch screen are disclosed. The system includes a processor, a touch screen coupled to the processor, and a gesture module coupled to the processor for executing a gesturing method. The method includes determining a gesture shape. For example, when the gesture shape is an arc or a line between two touching lines, the method calculates the measurement of the angle between the touching lines and behind the gestured line or arc. When the gesture is a line crossing a segment, the method calculates the measurement from the beginning of the segment to the end of the segment. The method further displays the calculated measurement of at least one of the angle or the segment.

16 Claims, 2 Drawing Sheets

(51) Int. Cl.
*G06T 11/20* (2006.01)
*G06F 17/50* (2006.01)

(56) References Cited

U.S. PATENT DOCUMENTS

| | | | | |
|---|---|---|---|---|
| 7,453,439 B1* | 11/2008 | Kushler | G06F 3/0237 | 345/168 |
| 8,686,943 B1* | 4/2014 | Rafii | G06F 3/017 | 345/158 |
| 9,235,310 B2* | 1/2016 | Iwasaki | G06F 3/045 | |
| 2001/0030642 A1* | 10/2001 | Sullivan et al. | G06F 3/0421 | 345/157 |
| 2002/0039084 A1* | 4/2002 | Yamaguchi | A61B 6/461 | 345/1.1 |
| 2002/0113784 A1* | 8/2002 | Feilmeier | G06F 1/1626 | 345/419 |
| 2002/0118880 A1* | 8/2002 | Liu et al. | G06K 9/00335 | 382/199 |
| 2002/0141643 A1* | 10/2002 | Jaeger | G06F 3/0481 | 382/181 |
| 2002/0146175 A1* | 10/2002 | Goldfoot | G06K 9/222 | 382/203 |
| 2003/0043214 A1* | 3/2003 | Thompson | G06F 3/04842 | 715/863 |
| 2003/0137494 A1* | 7/2003 | Tulbert | G06F 3/0423 | 345/173 |
| 2004/0027381 A1* | 2/2004 | Jaeger | G06F 3/0481 | 715/764 |
| 2004/0125312 A1* | 7/2004 | You et al. | G02F 1/13338 | 349/149 |
| 2004/0140956 A1* | 7/2004 | Kushler et al. | G06F 3/04883 | 345/168 |
| 2004/0193413 A1* | 9/2004 | Wilson et al. | G06F 3/017 | 704/243 |
| 2004/0267695 A1* | 12/2004 | Alho et al. | G06F 17/50 | |
| 2005/0057535 A1* | 3/2005 | Liu et al. | G06F 3/03545 | 345/179 |
| 2005/0154431 A1* | 7/2005 | Quistgaard | A61B 5/6843 | 607/96 |
| 2006/0001654 A1* | 1/2006 | Smits | G06F 3/03542 | 345/176 |
| 2006/0001656 A1* | 1/2006 | LaViola, Jr. | G06F 3/04883 | 345/179 |
| 2006/0025218 A1* | 2/2006 | Hotta | A63F 13/06 | 463/37 |
| 2006/0026536 A1* | 2/2006 | Hotelling | G06F 3/0418 | 715/863 |
| 2006/0028457 A1* | 2/2006 | Burns | G06F 3/0421 | 345/179 |
| 2006/0125803 A1* | 6/2006 | Westerman | G06F 3/04883 | 345/173 |
| 2008/0072234 A1* | 3/2008 | Myroup | G06F 3/0481 | 718/106 |
| 2009/0189877 A1* | 7/2009 | Washino | G06F 3/045 | 345/174 |
| 2009/0319237 A1* | 12/2009 | Nishikawa | G06T 19/00 | 703/1 |
| 2009/0322701 A1* | 12/2009 | D'Souza | G06F 3/045 | 345/174 |
| 2010/0044121 A1* | 2/2010 | Simon | G06F 3/03547 | 178/18.03 |
| 2010/0309115 A1* | 12/2010 | Sabanai | G06F 3/04845 | 345/156 |
| 2011/0025642 A1* | 2/2011 | Tada | G06F 3/0416 | 345/174 |
| 2011/0157083 A1* | 6/2011 | Hershman | G06F 3/045 | 345/174 |
| 2011/0221701 A1* | 9/2011 | Zhang | G06F 3/0418 | 345/174 |
| 2011/0285657 A1* | 11/2011 | Shimotani | G06F 3/0416 | 345/173 |
| 2012/0115626 A1* | 5/2012 | Davenport | A63B 24/0006 | 473/223 |
| 2012/0162265 A1* | 6/2012 | Heinrich | G06Q 10/06393 | 345/661 |
| 2012/0200604 A1* | 8/2012 | Imaeda | G01C 21/3664 | 345/650 |
| 2012/0203502 A1* | 8/2012 | Hayes | G01C 15/002 | 702/155 |
| 2012/0216141 A1* | 8/2012 | Li | G06K 9/00416 | 715/780 |
| 2012/0303336 A1* | 11/2012 | Becker | B64F 5/00 | 703/1 |
| 2012/0313870 A1* | 12/2012 | Homma | G06T 11/20 | 345/173 |
| 2012/0313975 A1* | 12/2012 | Homma | G06F 3/048 | 345/672 |
| 2012/0322527 A1* | 12/2012 | Aoki | G07F 17/3206 | 463/16 |
| 2013/0147711 A1* | 6/2013 | Njolstad | G06F 3/011 | 345/158 |
| 2013/0201157 A1* | 8/2013 | Chung | G06F 3/0325 | 345/175 |
| 2013/0271430 A1* | 10/2013 | Nakamura | G06F 3/04845 | 345/178 |
| 2013/0325342 A1* | 12/2013 | Pylappan | G10L 21/00 | 701/533 |
| 2014/0002414 A1* | 1/2014 | Iwasaki | G06F 3/045 | 345/174 |
| 2014/0009492 A1* | 1/2014 | Fujii | G09G 5/32 | 345/629 |
| 2014/0145975 A1* | 5/2014 | Sim | G06F 3/04845 | 345/173 |
| 2014/0157142 A1* | 6/2014 | Heinrich | H04L 67/1095 | 715/744 |
| 2014/0232695 A1* | 8/2014 | McGaughan | G06F 3/0425 | 345/175 |
| 2014/0232859 A1* | 8/2014 | Kotzur | G01C 1/04 | 348/135 |
| 2014/0267115 A1* | 9/2014 | Jeon | G06F 3/041 | 345/173 |
| 2014/0300606 A1* | 10/2014 | Nakada | G06T 11/203 | 345/441 |
| 2014/0340335 A1* | 11/2014 | Fleischmann | G06F 3/04883 | 345/173 |
| 2015/0082217 A1* | 3/2015 | Tumwattana | G06F 3/0485 | 715/769 |
| 2015/0106769 A1* | 4/2015 | Yamazaki | G06F 3/0488 | 715/857 |
| 2015/0355827 A1* | 12/2015 | Van Der Westhuizen | G06F 3/0482 | 715/788 |
| 2016/0054887 A1* | 2/2016 | Tumwattana | G06F 3/0488 | 715/810 |
| 2016/0109960 A1* | 4/2016 | Steinle | G06F 1/1601 | 345/173 |
| 2016/0196042 A1* | 7/2016 | Laute | G06F 3/017 | 715/845 |

* cited by examiner

∠ CAB ≡ 56.4° d(DE) = 7.17 cm

METHOD AND SYSTEM FOR PROCESSING GESTURES TO CAUSE COMPUTATION OF MEASUREMENT OF AN ANGLE OR A SEGMENT USING A TOUCH SYSTEM

CROSS REFERENCES TO RELATED APPLICATIONS

This application claims priority from U.S. Provisional Patent Application No. 61/947,747 filed on Mar. 4, 2014, which is hereby incorporated by reference in its entirety.

BACKGROUND OF THE INVENTION

Field of the Invention

Embodiments of the present invention generally relate to a method and system for processing gestures to cause computation of measurements of an angle or a segment using a touch system.

Description of the Related Art

In a touch system, measuring segments and angles is cumbersome. Angles are generally defined by three (3) points. Calculating the measurement of an angle generally involves multiple steps—accessing the menu, choosing a measurement tool, and then touching the three points defining the angle.

Therefore, there is a need for a method and/or apparatus for processing gestures to cause computation of measurements of an angle or a line using a touch system.

SUMMARY OF THE INVENTION

Embodiments of the present invention relate to a method and a system for processing gestures to cause computation of measurements of an angle or a segment using a touch screen. The system includes a processor, a touch screen coupled to the processor, a gesture module coupled to the processor for executing a gesturing method. The method includes determining a gesture shape. For example, when the gesture shape is an arc or a line between two touching lines, the method calculates the angle between the touching lines and behind the gestured line or arc. When the gesture is a line crossing a segment, the method calculates the measurement from the beginning point of the segment to the end point of the segment. The method further displays the calculated measurement of at least one of the angle or the segment.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
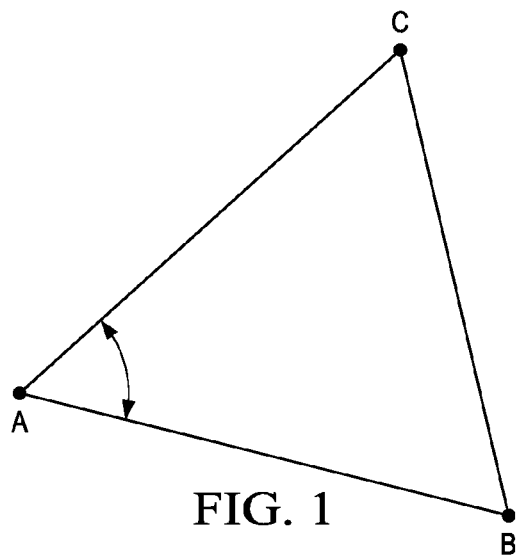
FIG. 1 is an embodiment of a diagram depicting a gesture for triggering calculating an angle using a touch screen.

Utilizing a touch screen, the user slides fingers, a pointer or the likes from one line to another. In some embodiments, a touch screen is a screen that is capable of recognizing a gesture without necessarily requiring an actual (e.g., physical) touch of the screen, such as, a gesture of hand, finger, stylus, motion, etc. In other embodiments, a touch screen is a screen that recognizes a gesture from actually touching the screen. FIG. 1 is an embodiment of a diagram depicting a gesture for triggering calculating measurement of an angle using a touch screen. In FIG. 1, an embodiment of an arc or a line drawn from one line of the angle to the other is depicted. As shown in FIG. 1, the user gestures an arc or a line from line AC to line AB or from AB to line AC to calculate angle CAB or BAC. While lines AC and AB are shown as touching (e.g., meeting at point A) in the depicted embodiment, it is understood that in other embodiments, such lines forming an angle need not necessarily touch.

Figure 2:
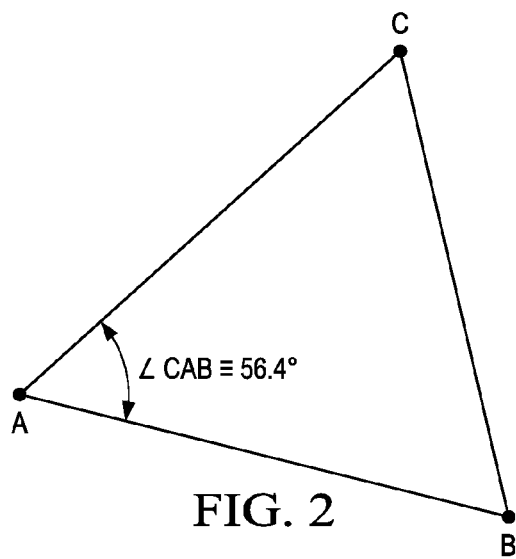
FIG. 2 is an embodiment of a diagram depicting a calculation of the angle of FIG. 1.

FIG. 2 is an embodiment of a diagram depicting a calculation of the angle of FIG. 1. As shown in FIG. 2, a method or system coupled to the touch screen recognizes the gesture and computes the angle's measurement, which is shown in FIG. 2 to be 56.4°.

Figure 3:
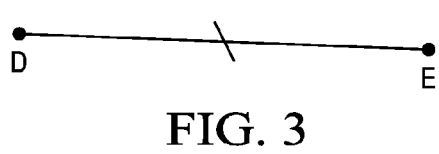
FIG. 3 is an embodiment of a diagram depicting a gesture for triggering calculating a segment using a touch screen.

In accordance with a further aspect of the present disclosure, a user utilizing a touch screen provides a gesture by sliding a finger, a pointer or the likes across a segment. FIG. 3 is an embodiment of a diagram depicting a gesture for triggering calculating measurement of a segment's length using a touch screen. In FIG. 3, an embodiment of a line drawn across a segment is depicted. As shown in FIG. 3, the user gestures a line crossing segment DE to calculate the measurement of segment DE.

Figure 4:
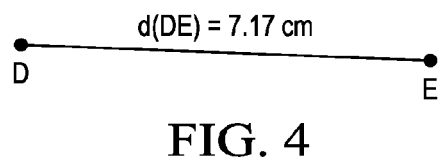
FIG. 4 is an embodiment of a diagram depicting a calculation of the segment of FIG. 3.

FIG. 4 is an embodiment of a diagram depicting a calculation of the segment of FIG. 3. As shown in FIG. 4, a method or system coupled to the touch screen recognizes the gesture and computes the measurement of the segment from the segment's beginning point to its end point, which is shown in FIG. 4 to be 7.17 cm.

Figure 5:
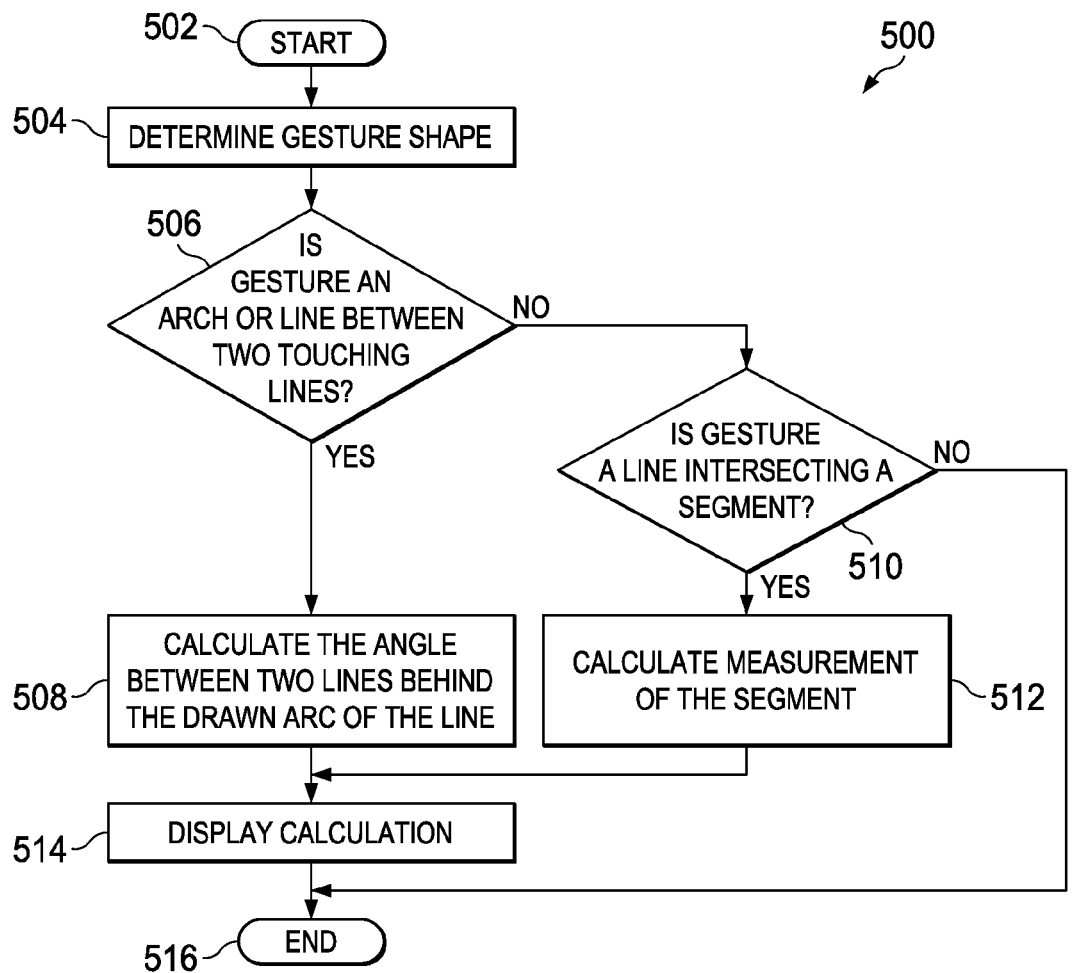
FIG. 5 is an embodiment of a flow diagram of a gesturing method for processing gestures to cause computation of measurements of an angle or a segment using a touch system.

FIG. 5 is an embodiment of a flow diagram of a gesturing method 500 for processing gestures to cause computation of measurements of an angle or a segment using a touch system. The method starts at step 502 and proceeds to step 504, wherein the method 500 determines the shape of the gesture. At step 506, the method 500 determines if the gestured shape is an arc or line between two touching lines. As stated above, in some embodiments, the two lines need not necessarily be touching. If a gestured arc or line is between two such lines, then the method 500 proceeds to step 508, wherein the angle between the lines and behind the arc or line is calculated. Otherwise, the method 500 proceeds to step 510.

At step 510, the method 500 determines if the gestured shape is a line that intersects a segment (e.g., one line as opposed to two lines). If it is, then the method 500 proceeds to step 512, wherein the measurement between the beginning point and the end point of the segment is calculated. Otherwise, the method 500 proceeds to step 516. From steps 508 and 512, the method 500 proceeds to step 514, wherein the calculated measurements are displayed and the method 500 proceeds to step 516. The method 500 ends at step 516.

Figure 6:
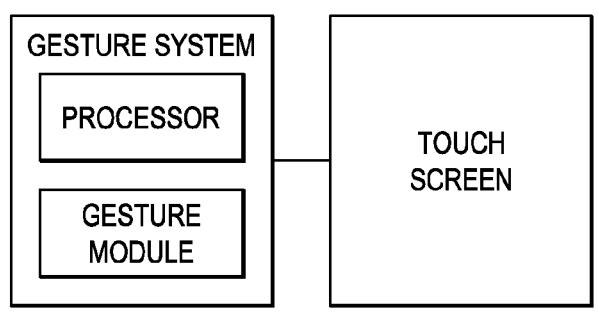
FIG. 6 is an embodiment of a system diagram utilizing the method of FIG. 5.

FIG. 6 is an embodiment of a gesture system diagram that performs or otherwise utilizes the method of FIG. 5. The gesture system comprises a processor, a gesture module and a touch screen. The processor is capable of executing instructions to perform functions, such as, calculating measurements, determining gestures from a touch screen, and the like. The gesture module performs a method such as the method 500 of FIG. 5. The touch screen is coupled to the processor directly, indirectly or wirelessly to facilitate gesture recognition and/or determination by the gesture system.

While the foregoing is directed to embodiments of the present invention, other and further embodiments of the invention may be devised without departing from the basic scope thereof, and the scope thereof is determined by the claims that follow.

What is claimed is:

1. A method for initiating a measurement calculation of one or more lines displayed on a touch screen display of a processor-based system, the method comprising:
   receiving a gesture input using the touch screen display;
   using a processor of the processor-based system to determine a gesture shape indicated by the gesture input;
   using the processor to determine the number of lines of the one or more lines that are selected by the gesture input, wherein each selected line of the one or more lines is indicated by the gesture shape touching the selected line, wherein touching the selected line comprises intersecting the selected line;
   when the number of selected lines is one, using the processor to identify a beginning point and an end point of the one selected line, calculate a measurement of length between the beginning point and the end point of the one selected line, and display the calculated measurement of the length on the touch screen display; and
   when the number of selected lines is two, using the processor to identify an angle formed between the two selected lines, calculate an angle measurement of the angle, and display the calculated angle measurement on the touch screen display.

2. The method of claim 1, wherein, when the number of selected lines is two, the two selected lines touch at a common point.

3. The method of claim 1, wherein, when the number of selected lines is two, the two selected lines do not touch each other.

4. The method of claim 1, wherein, when the number of selected lines is two, the calculated angle measurement is displayed on the touch screen display in close proximity to the two selected lines of the displayed one or more lines.

5. The method of claim 1, wherein, when the number of selected lines is one, the calculated measurement of length is displayed on the touch screen display in close proximity to the one selected line of the displayed one or more lines.

6. The method of claim 1, wherein the one or more lines is displayed on the touch screen display when the gesture input is received.

7. The method of claim 1, wherein the gesture shape is an arc.

8. The method of claim 1, wherein the gesture shape is a line.

9. A system comprising:
   a touch screen display configured to display one or more lines and having a touch screen configured to receive a gesture input;
   a processor communicatively coupled to the touch screen, the processor being configured to process a received gesture input; and
   a memory communicatively coupled to the processor and storing program instructions that, when executed by the processor, cause the processor to:
      determine a gesture shape indicated by the received gesture input;
      determine the number of lines of the displayed one or more lines that are selected by the gesture input, wherein each selected line of the geometric element is indicated by the gesture shape touching the selected line, wherein touching the selected line comprises intersecting the selected line;
      when the number of selected lines is one, identify a beginning point and an end point of the one selected line, calculate a length measurement between the beginning point and the end point of the one selected line, and display the calculated measurement of the length on the touch screen display; and
      when the number of selected lines is two, using the processor to identify an angle formed between the two selected lines, calculate an angle measurement of the angle, and display the calculated angle measurement on the touch screen display.

10. The system of claim 9, wherein, when the number of selected lines is two, the two selected lines touch at a common point.

11. The system of claim 9, wherein, when the number of selected lines is two, the two selected lines do not touch each other.

12. The system of claim 9, wherein, when the number of selected lines is two, the calculated angle measurement is displayed on the touch screen display in close proximity to the two selected lines of the displayed one or more lines.

13. The system of claim 9, wherein, when the number of selected lines is one, the calculated length measurement is displayed on the touch screen display in close proximity to the one selected line of the displayed one or more lines.

14. The system of claim 9, wherein the one or more lines is displayed on the touch screen display when the gesture input is received.

15. The system of claim 9, wherein the gesture shape is an arc.

16. The system of claim 9, wherein the gesture shape is a line.

* * * * *